(12) United States Patent
Wall et al.

(10) Patent No.: US 7,308,060 B1
(45) Date of Patent: Dec. 11, 2007

(54) SELF CORRECTING DATA RE-TIMING CIRCUIT AND METHOD

(75) Inventors: Brian Wall, Nepean (CA); Shawn Scouten, Kanata (CA); Kenji Suzuki, Kanata (CA); Malcolm Stevens, North Gower (CA)

(73) Assignee: Cortina Systems Corporation, Kanata, Ontario (CA)

( * ) Notice: Subject to any disclaimer, the term of this patent is extended or adjusted under 35 U.S.C. 154(b) by 960 days.

(21) Appl. No.: 10/373,301

(22) Filed: Feb. 26, 2003

Related U.S. Application Data (60) Provisional application No. 60/359,709, filed on Feb. 27, 2002.

(51) Int. Cl.
*H04L 7/00* (2006.01)
(52) U.S. Cl. ...................... 375/355; 375/376
(58) Field of Classification Search ............... 375/355, 375/371, 373, 376
See application file for complete search history.

(56) References Cited

U.S. PATENT DOCUMENTS 6,801,592 B1 * 10/2004 Christensen ................ 375/375

OTHER PUBLICATIONS

Intel® LXT16713 and LXT16714; downloaded from http://www.intel.com/design/network/products/optical/PHYs/1xt16713-14.htm on Feb. 18, 2002; pp. 1 to 6.
Zhong, Huiqing; Long, Stephen I.; Monothic Clock and Data Recovery Chip for 10GB/S Fiber Communications Systems; Final Report 1997-98, Mirco Project #97-105 Industrial Sponsor: Conexant Systems, Inc.; pp. 1-4.

* cited by examiner

*Primary Examiner*—David B. Lugo (57) ABSTRACT

An eye opener circuit is provided which performs a data re-timing/eye opening function on a data signal after having been corrupted by jitter. The circuit uses a PLL driven by a clock source which was the same clock source used in timing the data signal originally. The PLL generates a local clock used to re-time the data. A phase error may be introduced into the PLL, or into the data signal.

19 Claims, 6 Drawing Sheets

SELF CORRECTING DATA RE-TIMING CIRCUIT AND METHOD

RELATED APPLICATION

This application claims the benefit of U.S. Provisional Application No. 60/359,709 filed Feb. 27, 2002.

FIELD OF THE INVENTION

The present invention relates generally to the field of data transmission. More particularly, the invention pertains to a method of reducing jitter (phase noise in the frequency domain) for data transmitted over a bandwidth-limited medium.

BACKGROUND OF THE INVENTION

Communication system providers that design and build data networks continue to provide new equipment that enables operators to provide higher data bandwidths to their customers. At the same time, operating companies purchasing the networking equipment prefer the equipment to be modular, such that the overall communication system is a combination of components that can be easily interchanged and interconnected. Additionally, it is desirable that each new generation of products enables increased data bandwidth in the same size time domain frame as their lower bandwidth predecessors, without increasing the amount of power they consume. Modern communication systems typically are a mosaic of new and old products that are able to function together.

Adding to the mosaic of different components that make up the network, there are currently several standards (specifications) which optical systems may be designed to satisfy that define the transmission and reception specifications for 10G serial data. Examples of such specifications include Multi-Source Agreement (MSA), XENPAC and XFP. These specifications call for circuitry such as SERDES (serializer/deserializer) devices, which could be removed from the optical modules and placed on a system line card to reduce the optical modules, cost and power consumption. This would allow the SERDES devices to be incorporated into devices on the line card, which would increase the overall level of integration.

XFP specifies various electrical characteristics at the module interface, and specifies up to 12 inches of transmission line on FR4 material, an inexpensive PCB material, followed by the SERDES.

However, by integrating the SERDES devices within the line card, the 10 Gbps serial data would then have to be transmitted from the line card to the optical module and this introduces jitter into the signal. The jitter is composed of random and/or deterministic components. The deterministic component is generally caused by bandwidth limitations in the system and is typically data dependent, in the form of ISI (inter-symbol interference). The random jitter is typically low frequency, for example 50 KHz→80 MHz for 10 Gbps SONET applications and is caused by shot noise, flicker noise, or thermal noise in the PLL or the PLL reference all of which convert to phase noise. Other processes that can effect or introduce phase noise include crosstalk from other noise sources and power supply noise.

Systems specifications typically impose rather strict limitations on the amount of jitter that can be generated and injected into optical data being transmitted by the optical module. There are also jitter limitations that apply to the electrical circuits used to drive the optical lasers or optical modulators used for transmission. These limitations lead to the requirement for the bandwidth of the printed circuit board (PCB) and connector over which the data is transmitted from the system to the optical module (and vice versa), to be high enough so as not to impair the data signal by increasing the deterministic jitter. For systems transmitting 10 Gbps serial data and above, the inexpensive connector typically employed to connect the line card to the optical module and lossy PCB material on which the system line card is built significantly limit the transmission bandwidth. As a result the interconnections do not generally support high enough bandwidths and will impair the data signal by increasing its jitter.

It would be desirable for optical modules to provide a low cost, low power-consumption solution to remove the jitter before converting the electrical signal to an optical signal.

One method of re-timing the data is using a CDR (Clock and Data Recovery circuit). The CDR will take the data signal as its input and use it to derive a clock, which can be used to re-time the data. An example is a CDR based on a HOGGE type phase detector or Bang Bang phase detector, both common phase detectors in the art. Because the data is used as a reference for the CDR, this method requires that the data being transmitted from the SERDES device must have low jitter. The CDR will remove any high frequency jitter but will still transfer low frequency jitter. The CDR will not remove any low frequency jitter caused by the SERDES device. Furthermore, since the CDR is not noiseless the output of the CDR will have more jitter than that of the SERDES device because it will transfer the low frequency jitter of the SERDES device and add a small amount of noise of its own to the transmitted data-signal.

SUMMARY OF THE INVENTION

According to one broad aspect, the invention provides a method of re-timing a data signal comprising: comparing the data signal to a locally generated clock signal to produce a phase error signal; generating the locally generated clock signal with a phase locked loop having an external clock signal which was also used in generating timing for the data signal, the phase locked loop being further adapted to apply a phase adjustment proportional to the phase error signal; sampling the data signal using locally generated clock signal to produce a sequence of samples; and using the locally generated clock signal, generating a new re-timed data signal from the sequence of samples.

In some embodiments, the phase locked loop uses a phase mixer to apply the phase adjustment proportional to the phase error.

In some embodiments, the phase locked loop uses a variable delay element to apply a variable delay as a function of the phase error to the external clock signal as input to the phase locked loop.

In some embodiments, the phase locked loop uses an offset element to apply the phase error.

In some embodiments, the method further comprises low pass filtering the phase error signal before applying the phase adjustment.

In some embodiments, the method applies to a high speed serial data signal after transmission over a path which introduces jitter.

In some embodiments, the method comprises generating the phase error signal using a control loop having relatively low bandwidth while the phase locked loop used to generate the locally generated clock signal has a relatively high bandwidth.

According to another broad aspect, the invention provides an eye opener circuit comprising: a phase detector and data re-timer adapted to compare an input data signal to a locally generated clock signal to produce a phase error signal, and to sample the data signal using the locally generated clock signal to generate a sequence of samples, and to generate a new re-timed data signal having low jitter using the locally generated clock signal; a phase locked loop adapted to generating the locally generated clock signal, the phase lock loop driven by an external clock signal which was also used in generating timing for the input data signal, the phase locked loop being adapted to apply a phase adjustment proportional to the phase error signal.

In some embodiments, the phase locked loop comprises a phase mixer circuit adapted to apply said phase adjustment.

In some embodiments, the phase locked loop comprises a variable delay element adapted to apply a variable delay as a function of the phase error to the external clock signal as input to the phase locked loop.

In some embodiments, the phase locked loop comprises: an offset element to apply the phase error.

In some embodiments, the phase error signal is generated using a control loop having relatively low bandwidth while the phase locked loop used to generate the locally generated clock signal has a relatively high bandwidth.

In some embodiments, the phase detector and data re-timer comprise a modified HOGGE detector.

In some embodiments, the phase detector comprises a phase mixer adapted to apply the phase error determined by the phase detector and data re-timer.

According to another broad aspect, the invention provides an optical module comprising: a transmit path for receiving an electrical signal, converting the electrical circuit to an optical signal and outputting the optical signal, the transmit path comprising an eye opener circuit, the eye opener circuit comprising: a phase detector and data re-timer adapted to compare an input data signal to a locally generated clock signal to produce a phase error signal, and to sample the data signal using the locally generated clock signal to generate a sequence of samples, and to generate a new re-timed data signal having low jitter using the locally generated clock signal; a phase locked loop adapted to generate the locally generated clock signal using external clock signal which was also used in generating timing for the input data signal, the phase locked loop being adapted to apply a phase adjustment proportional to the phase error signal.

In some embodiments, the optical module further comprises a connector through which is received the input data signal and the external clock signal.

According to another broad aspect, the invention provides an apparatus comprising: a clock source, an optical module, a line card and a connector connecting the optical module to the line card wherein: a clock source produces a clock signal which is passed to both the optical module and the line card; the line card comprises a first PLL driven by the clock signal, the first PLL being used to time a data signal transmitted to the optical module through the connector; the optical module has an eye opener circuit comprising a second PLL driven by the clock signal, the second PLL being used by the eye opener circuit to re-time the data signal as received through the connector.

In some embodiments, the clock signal is passed from the line card to the optical module over the connector.

Another broad aspect provides a method of re-timing a data signal which involves applying a variable delay to the data signal as a function of a phase error signal to generate a delayed data signal; comparing the delayed data signal to a locally generated clock signal to produce the phase error signal; generating the locally generated clock signal with a phase locked loop having an external clock signal which was also used in generating timing for the data signal; sampling the delayed data signal using the locally generated clock signal to produce a sequence of samples; and using the locally generated clock signal, generating a new re-timed data signal from the sequence of samples.

In some embodiments, the method further involves low pass filtering the phase error signal before applying the variable delay.

Another broad aspect of the invention provides an eye opener circuit having a variable delay element adapted to apply a variable delay to an input data signal as a function of a phase error signal to produce a delayed data signal; a phase detector and data re-timer adapted to compare the delayed data signal to a locally generated clock signal to produce the phase error signal, and to sample the data signal using the locally generated clock signal to generate a sequence of samples, and to generate a new re-timed data signal having low jitter using the locally generated clock signal; a phase locked loop adapted to generate the locally generated clock signal, the phase lock loop driven by an external clock signal which was also used in generating timing for the input data signal.

Another broad aspect of the invention provides an optical module having a transmit path for receiving an electrical signal, converting the electrical circuit to an optical signal and outputting the optical signal, the transmit path comprising an eye opener circuit, the eye opener circuit comprising: a variable delay element adapted to apply a variable delay to an input data signal as a function of a phase error signal to produce a delayed data signal; a phase detector and data re-timer adapted to compare the delayed data signal to a locally generated clock signal to produce the phase error signal, and to sample the data signal using the locally generated clock signal to generate a sequence of samples, and to generate a new re-timed data signal having low jitter using the locally generated clock signal; a phase locked loop adapted to generate the locally generated clock signal, the phase lock loop driven by an external clock signal which was also used in generating timing for the input data signal.

Another broad aspect of the invention provides a method of re-timing a data signal which involves comparing the data signal to a locally generated clock signal to produce a phase error signal; generating the locally generated clock signal with a phase locked loop having an external clock signal which was also used in generating timing for the data signal and by applying a variable delay to an output of the phase locked loop which is a function of the phase error signal; sampling the data signal using the locally generated clock signal to produce a sequence of samples; and using the locally generated clock signal, generating a new re-timed data signal from the sequence of samples.

Another broad aspect of the invention provides an eye opener circuit having a phase detector and data re-timer adapted to compare an input data signal to a locally generated clock signal to produce a phase error signal, and to sample the data signal using the locally generated clock signal to generate a sequence of samples, and to generate a new re-timed data signal having low jitter using the locally generated clock signal; a phase locked loop driven by an external clock signal which was also used in generating timing for the input data signal; a variable delay element adapted to produce the locally generated clock signal by applying a variable delay to an output of the phase locked loop, the variable delay being a function of the phase error signal.

BRIEF DESCRIPTION OF THE DRAWINGS

Preferred embodiments of the invention will now be described in greater detail with reference to the accompanying diagrams, in which.

DETAILED DESCRIPTION OF THE INVENTION

Figure 1:
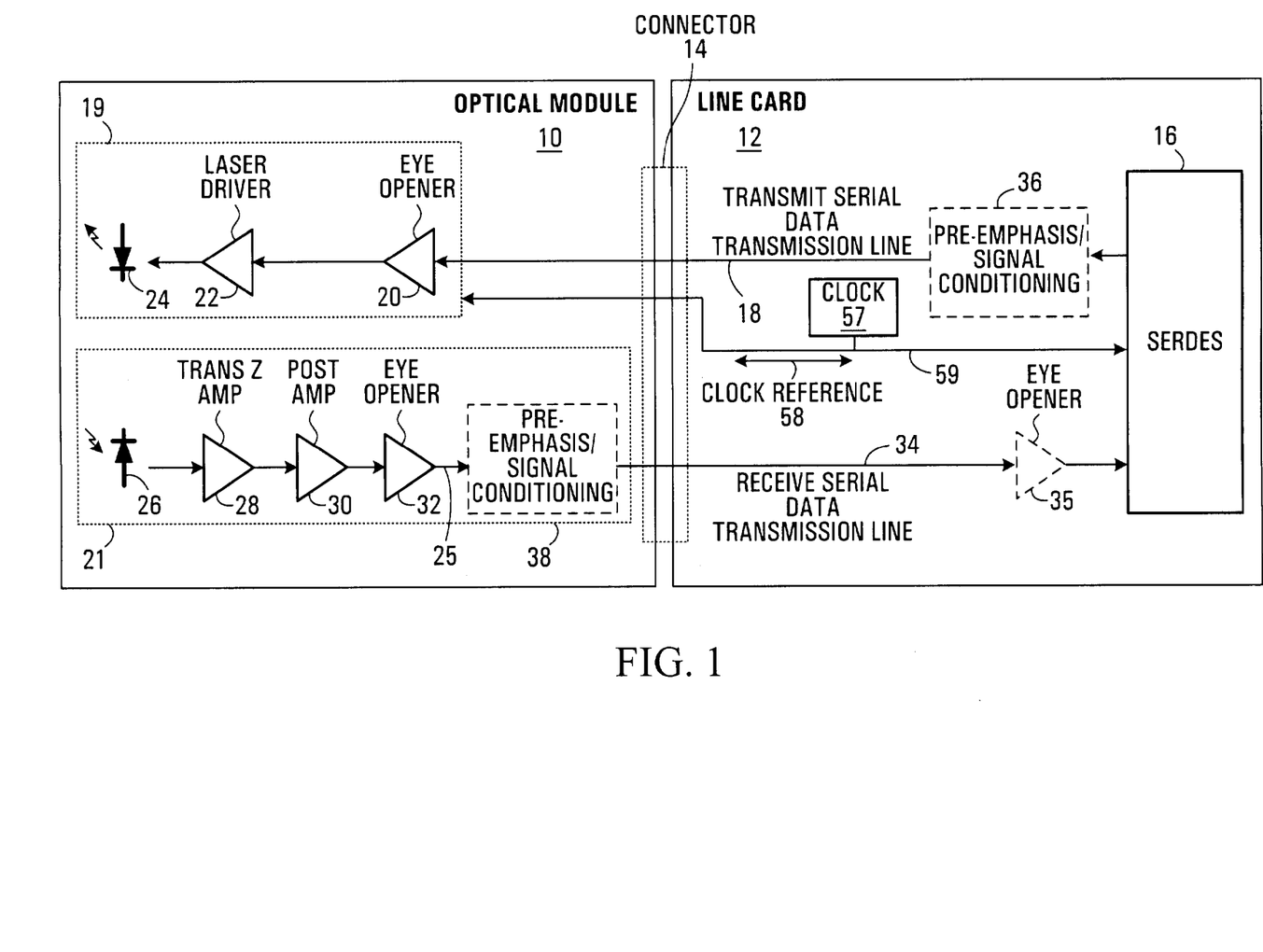
FIG. 1 is a block diagram of an optical module and connector and line card provided by an invention.

Referring to FIG. 1 an optical module 10 is shown connected to a line card 12 via a connector 14.

The electronic components of the line card 12 are placed atop a lossy PCB (Printed Circuit Board) substrate onto which conductive tracks are fabricated. For the purposes of the present description a SERDES device 16 is shown on the line card driven by a clock 57 which generates clock reference 58. Two conductive tracks 18, 34 from the SERDES 16 to the connector 14 are also shown. Also shown is a connection 59 through the connector 14 from the clock 57 providing the clock reference 58 to the optical module. An eye opener circuit 35 is shown on the receive path. Because standard specifications tend to be less stringent on the receive path, it is not necessary in all implementations to include this eye opener circuit 35. Some implementations might include a pre-emphasis/signal conditioning function 36. This would likely be implemented as part of the SERDES 16. More generally, it is understood in the art that the line card would in fact have more components which typically comprise some combination of hardware, software, firmware, etc.

The optical module 10 also has a number of components. As shown in FIG. 1, the optical module 10 has transmit path functionality generally indicated by 19, and receive path functionality generally indicated by 21. The transmission path 19 is fed a serial data signal by the conductive track 18 via the connector 14. The transmit path 19 has an eye opener circuit 20, a laser driver 22 and a laser diode 24 connected in sequence.

The receive path 21 accepts an incoming optical signal and delivers a serial data signal to the SERDES device via the connector 14 and the conductive track 34 on the line card 12. The receive path 21 has an optical diode 26, a trans-impedance amplifier 28, a post amplifier 30 and an eye opener circuit 32 connected in sequence. Some implementations might include a pre-emphasis/signal conditioning function 38. More generally, in practice the optical module 10 would also have a further combination of hardware, software, firmware, etc. but these have been omitted for clarity of description.

For systems transmitting 10 Gbps serial data and above, the connector and lossy PCB substrate do not generally provide a transmission medium between the optical module and the line card that has a high enough bandwidth such that the data signals will not suffer from increased jitter. The effects of this can be seen in the time domain as increased jitter within the data signal. The data is impaired because the low bandwidth of the transmission medium causes high frequency jitter to be injected into the data-signal.

As provided by the present invention, the eye opener circuits are used to re-time the data and thereby reduce the jitter.

It is noted that the eye opener circuit 32 on the receive path 21 of the optical module 10 would be different from the eye opener circuit 20 on the transmit path 19 since signals being processed there have not yet been corrupted by the transmission over the connector 14 and transmission line 34. The eye opener might for example pre-filter the signal with a transfer function having an inverse to that of the connector and or the receive transmission line. Alternatively, the eye opener circuit 32 can be implemented on the line card instead in which case the implementation will be similar to that on the transmit path 19.

Figure 2:
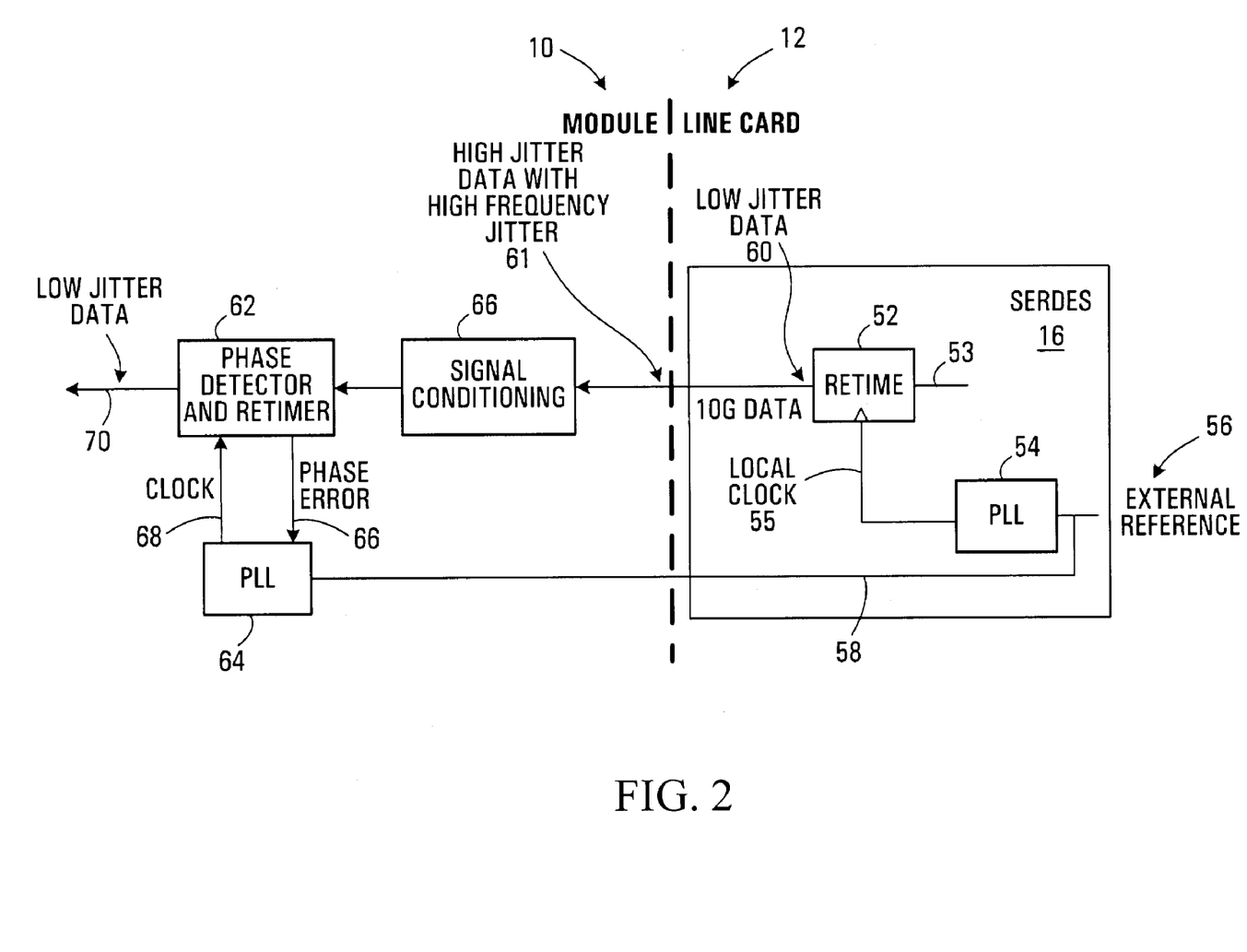
FIG. 2 is a block diagram of an eye opener circuit showing used in the optical module of FIG. 1 showing its interaction with the SERDES of FIG. 2.

Referring now to FIG. 2, shown is a block diagram of an embodiment of the eye opener circuit 20 together with part of the line card 12 showing how it interacts with the eye opener circuit 20. The eye opener circuit 20 has a phase detector and re-timer 62 and a PLL (phase locked loop) 64. Some embodiments include a further signal conditioning block/function 66. On a line card side, the SERDES 16 receives a data signal 53 which is timed or re-timed 52 locally to produce a low jitter data signal 60 which is then sent to the optical module 10 across the connector where it is received as a high jitter data signal with high frequency jitter 61. The line card has a clock reference 56 which might for example be approximately 161.13 MHz which drives a PLL 54 which generates the local clock 55 used to time the data. The local clock 55 might for example have a frequency of 10.3125 GHz. This same clock reference 56 is passed over to the PLL 64 in the eye opener circuit 20 such that both PLLs 54, 64 are driven by the same clock reference 56. This clock reference can be split off at the input to the PLL 54 and sent over the connector to the PLL 64 on the optical module 10. Preferably, the clock is split off external to line card 12 as this reduces any spurious interference effects. More generally, any suitable structure may be employed to deliver the same clock reference to both the PLLs 54, 64. It is noted that because the clock reference is typically a single tone, it does not suffer from being sent over the connector or short lengths of transmission line.

It is important to note that comparing the circuit of FIG. 2 with a conventional clock and data recovery circuit, conventional circuits regenerate the clock in the optical module by extracting the clock from the data signal and then driving the PLL locally to produce a clock which re-times the data. What this means is that there are effectively two PLLs which are cascaded, one in the line card and one in the module. Such an arrangement suffers from the drawbacks described in the background section above. The arrangement of FIG. 2 does not have two cascaded PLLs, but rather has two PLLs both working off the same reference clock.

The phase detector and re-timer 62 accept a clock signal 68 from the PLL 64 and the incoming data signal 61 from the line card 12. The signal conditioner may for example comprise a limiting amplifier, AGC or equalizer or any combination of these devices. The data signal 61 enters the eye opener 20 with excess jitter and must be re-timed to remove the jitter. In order to do this the phase detector portion of the circuit 62 compares the clock signal 68 and data signal 61 and generates a phase error signal 66 that is a function of the phase difference between the data signal and clock signal. The data re-timer portion of the circuit 62 is used to sample the data signal 61 and regenerate a low jitter data signal 70.

The PLL 64 accepts the clock reference 58 and the phase error signal 66 from the phase detector and re-timer 62. The PLL 64 then generates the clock signal 68 used by the phase detector and re-timer 62 to compare and sample the incoming data signal 61. The phase error signal 66 is used by the PLL 64 to adjust the clock phase so that the clock can sample the data in an optimal way. For optimal performance and stability reasons, the control loop that is used to adjust the clock phase preferably has very low bandwidth while the PLL 64 has a higher bandwidth optimized for minimum jitter generation of the clock signal 68 used to re-time the data. The data signal and the reference clock are in general frequency locked to one another. It is also desirable to ensure that the reference clock rate is an integer multiple of the data rate.

Figure 3:
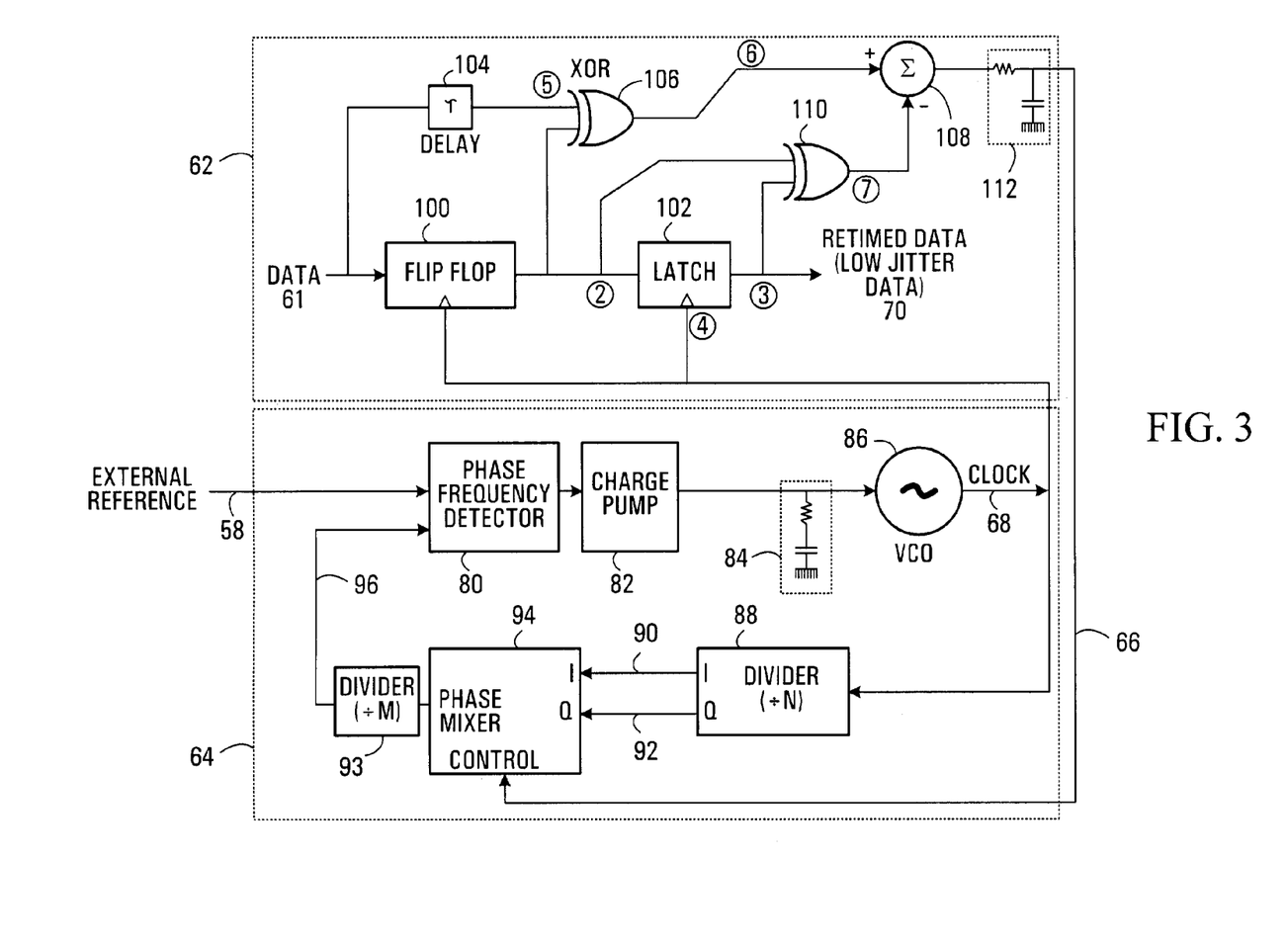
FIG. 3 is a block diagram of an example implementation of the eye opener circuit of FIG. 2.

Referring now to FIG. 3, shown is a detailed block diagram of one example implementation of the eye opener circuit 20. The top portion of the drawing is the phase detector and re-timer circuit 62 and is implemented using a modified HOGGE detector. The bottom part of the drawing shows the PLL 64. The HOGGE detector takes the data signal 61, this being the high jitter signal received over the connector and this is input to a flip flop 100 and also to a delay element 104. The outputs of the flip flop 100 and the delay element 104 are fed into a first XOR circuit 106. The flip flop output is also fed to a latch circuit 102. The input and output of the latch circuit 102 are both fed to a second XOR gate 110. The flip flop 100 and latch circuit 102 are both clocked by an output of the PLL 64, this being the clock signal 68. The output of the latch circuit 102 is the re-timed data 70. The output of the second XOR gate 110 is subtracted from the output from the first XOR gate 106 with subtractor 108. The output of subtractor 108 is filtered with low pass filter 112 and then passed as phase error signal 66 to the PLL 64 as a control input representing phase error.

It is to be understood that other methods of extracting a phase error may alternatively be employed. A very specific modified HOGGE detector design has been shown but it is to be understood that any circuit capable of extracting a phase error signal, and re-timing based on a clock input can be employed. For example a Bang Bang phase detector or mixer/multiplier may be used. The phase error signal 66 is a low frequency signal which represents the difference between the clock signal 68 being used to drive the circuit and the centre of the data eye.

The PLL 64 has a phase frequency detector (PFD) 80 which has as its input the external reference 58 which is the same reference used to drive the PLL 54 on the line card 12. The output of the PFD is fed to a charge pump 82 and filter 84 the output of which drives a local oscillator (VCO) 86. The output of the VCO 86 is the regenerated clock signal 68 which is fed to the phase detector and re-timer circuit 62. The clock signal 68 is also fed back around the PLL 64 through a divider 88 which divides the clock and produces I and Q outputs 90, 92. In the illustrated example, the divider 88 divides the clock by N. A phase mixer 94 receives the I and Q outputs 90, 92 and adjusts the clock phase as a function of the phase error 66 received from the phase detector and re-timer circuit 62. A second divider 93 is shown which further divides the signal output by the phase mixer 94. The divided clock signal 96 that is produced is fed back to an input of the phase frequency detector 80. There are other ways of applying the phase error 66 within the PLL 64. The ratio between the frequencies of clock signal 68 and the external reference 58 is determined by the product of N×M. If M is one, then the second divider 93 would not be needed. In the example in which the external reference is 161.11 MHz and the local clock is 10.3125 GHz, the ratio is 64. N and M are integer multiples and might for example be set to 4 and 16 respectively. Other values can be employed for the clocks.

Figure 4:
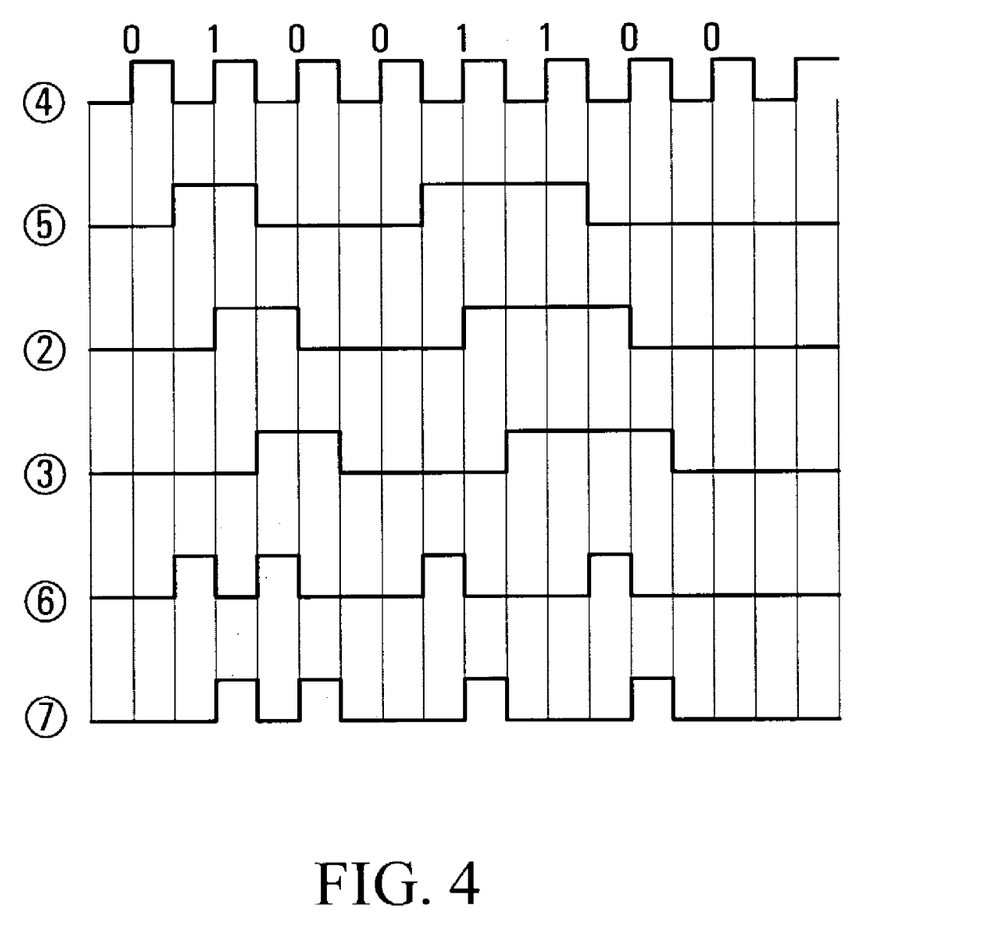
FIG. 4 is a timing diagram showing how data is re-timed using the circuit of FIG. 3.

FIG. 4 is a timing diagram showing example signals which might be produced by the diagram of FIG. 3.

Signal 5 in FIG. 4 represents data signal 61 after being subject to a delay. The output of the flip flop 100 is signal number 2, this being the signal that is input to XOR gate 106, XOR gate 110 and the latch circuit 102. Latch circuit 102 operates as a function of the input signal number 2 and the clock signal 68 shown as signal 4 in FIG. 4. The output of the latch 102 is the re-timed data 70, labelled as signal number 3 in FIG. 4. Signal 6 is output by XOR gate 106, this being signal 5 XOR signal 2. Signal 7 is output by XOR gate 110, this being signal 2 XOR signal 3.

Figure 5:
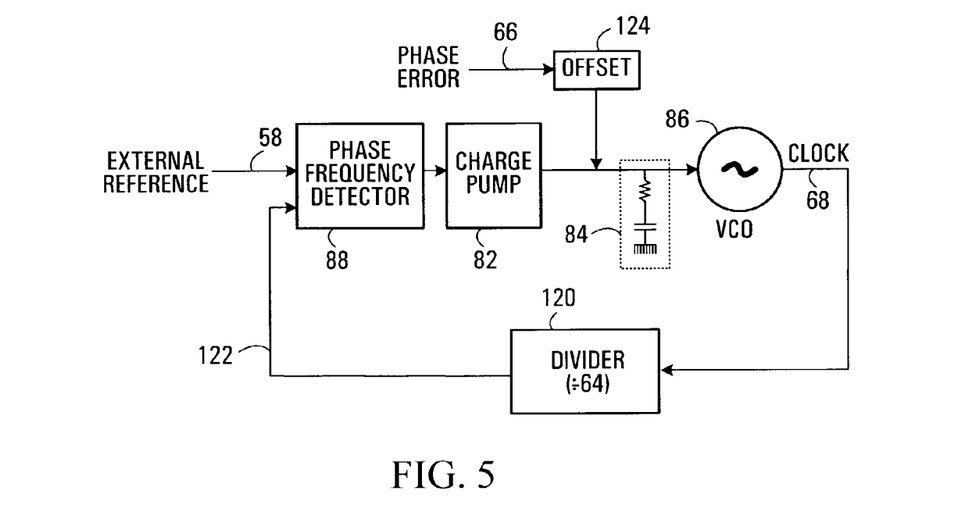
FIGS. 5, 6, 7 and 8 are block diagrams showing four alternative ways to inject phase error.

As discussed above, the invention is not limited to the particular circuit of FIG. 3 used to introduce the phase error into PLL 64. FIG. 5 shows another example implementation of the PLL 64. In this case, the phase error signal 66 is introduced to an offset block 124 which is connected at the output of the charge pump 82. The offset block 124 generates a DC current proportional to the phase error 66. The clock signal 68 is divided by divider 120 which produces a divided clock 122 which is input to the phase frequency detector. An offset to a charge pump caused by a small current will cause a static phase error.

Figure 6:
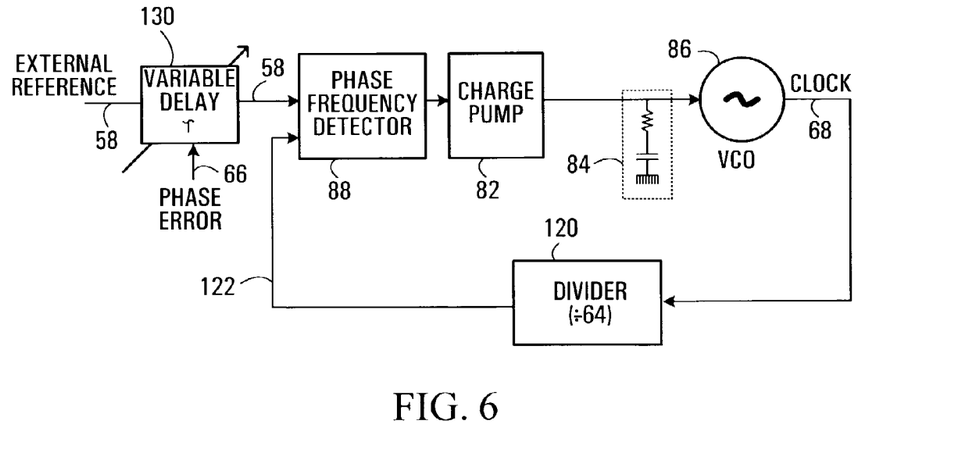

FIG. 6 is another example implementation of the PLL 64. In this embodiment, the phase error 66 is applied by introducing a variable delay with delay element 130. This variable delay is applied directly to the external reference 58. The external reference thus delayed is input to the phase frequency detector 88. In this case, like the embodiment of FIG. 5, the divider 120 produces a divided clock signal 122 which is input as the other inputs to the phase frequency detector 88.

Figure 7:
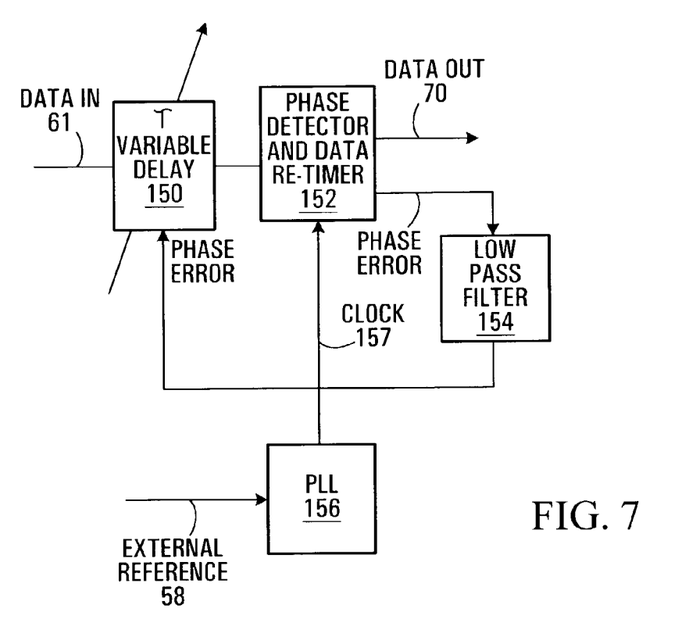

FIG. 7 is another example implementation of the eye opener circuit. In this embodiment, once again the clock reference signal 58 is received, for example through the connector (not shown). The incoming data signal with high jitter is again indicated at 61, and the re-timed low jitter signal is indicated at 70. The input signal 61 is fed through a variable delay element 150 the output of which is passed to a phase detector and data re-timer 152 which might for example be a HOGGE phase detector. The outputs of the phase detector and data re-timer include the re-timed data signal 70 and a phase error signal which is low pass filtered with low pass filter 154. The filtered phase error signal is fed back to the variable delay element 150 and used to control a variable delay introduced into the data signal. The external reference 58 drives a PLL 156 which in turn generates a local clock signal 157 which drives the HOGGE phase detector 152. This embodiment differs from the previous embodiments in that the phase error is applied directly to the incoming data signal as opposed to being applied to the PLL. As was the case with the embodiments in which the phase error was applied to the PLL, there are various mechanisms of introducing the delay into the incoming data signal and these will not be elaborated upon further here.

Figure 8:
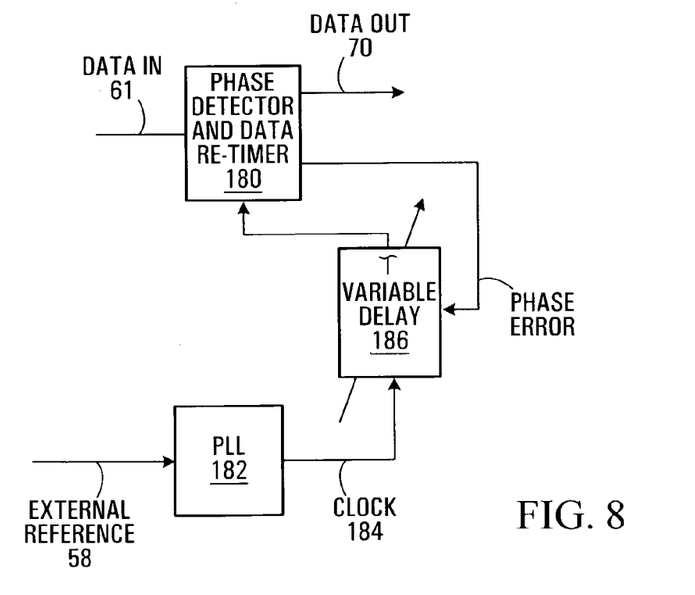

FIG. 8 is another example implementation of the eye opener circuit. In this embodiment, once again the clock reference signal 58 is received, for example through the connector (not shown). The incoming data signal with high jitter is again indicated at 61, and the re-timed low jitter signal is indicated at 70. The input signal 61 is passed to a phase detector 180 which might for example be a HOGGE phase detector. The outputs of the HOGGE phase detector include the re-timed data signal 70 and a phase error signal which is preferably low pass filtered with a low pass filter (not shown). The filtered phase error signal is fed back to the variable delay element 186 and used to control a variable delay introduced into the clock signal generated by the PLL 182. The external reference 58 drives the PLL 182 which in turn generates clock signal 184 which, after being delayed by the variable delay element 186, drives the phase detector and data re-timer 180. This embodiment differs from the previous embodiments in that the phase error is applied directly to the output of the PLL. As was the case for other embodiments, there are various ways of applying the phase error to the output of the PLL to the same effect, and these will not be elaborated upon here.

What has been described is merely illustrative of the application of the principles of the invention. Other arrangements and methods can be implemented by those skilled in the art without departing from the spirit and scope of the present invention.

Numerous modifications and variations of the present invention are possible in light of the above teachings. It is therefore to be understood that within the scope of the appended claims, the invention may be practiced otherwise than as specifically described herein.

The invention claimed is:

1. A method of re-timing a data signal comprising:
comparing the data signal to a locally generated clock signal to produce a phase error signal;
generating the locally generated clock signal with a phase locked loop having an external clock signal which was also used in generating timing for the data signal, the phase locked loop being further adapted to apply a phase adjustment proportional to the phase error signal using a variable delay element to apply a variable delay as a function of the phase error to the external clock signal as input to the phase locked loop;
sampling the data signal using the locally generated clock signal to produce a sequence of samples; and
using the locally generated clock signal, generating a new re-timed data signal from the sequence of samples.

2. A method according to claim 1 further comprising low pass filtering the phase error signal before applying the phase adjustment.

3. A method according to claim 1 applied to a high speed serial data signal after transmission over a path which introduces jitter.

4. A method according to claim 1 comprising generating the phase error signal using a control loop having relatively low bandwidth while the phase locked loop used to generate the locally generated clock signal has a relatively high bandwidth.

5. An eye opener circuit comprising:
a phase detector and data re-timer adapted to compare an input data signal to a locally generated clock signal to produce a phase error signal, and to sample the data signal using the locally generated clock signal to generate a sequence of samples, and to generate a new re-timed data signal having low jitter using the locally generated clock signal;

a phase locked loop adapted to generate the locally generated clock signal, the phase locked loop driven by an external clock signal which was also used in generating timing for the input data signal, the phase locked loop being adapted to apply a phase adjustment as a function of the phase error signal, the phase locked loop further comprising a variable delay element adapted to apply a variable delay as a function of the phase error to the external clock signal as input to the phase locked loop.

6. An eye opener circuit according to claim 5 wherein the phase error signal is generated using a control loop having relatively low bandwidth while the phase locked loop used to generate the locally generated clock signal has a relatively high bandwidth.

7. An eye opener circuit according to claim 5 wherein the phase detector and data re-timer comprise a modified HOGGE detector.

8. An apparatus comprising:
a clock source, an optical module, a line card and a connector connecting the optical module to the line card wherein;
a clock source produces a clock signal which is passed to both the optical module and the line card;
the line card comprises a first PLL driven, by the clock signal, the first PLL being used to time a data signal transmitted to the optical module through the connector;
the optical module has an eye opener circuit comprising a second PLL driven by the clock signal, the second PLL being used by the eye opener circuit to re-time the data signal as received through the connector.

9. An apparatus according to claim 8 wherein the clock signal is passed from the line card to the optical module over the connector.

10. A method of re-timing a data signal comprising;
applying a variable delay to the data signal as a function of a phase error signal to generate a delayed data signal;
comparing the delayed data signal to a locally generated clock signal to produce the phase error signal;
generating the locally generated clock signal with a phase locked loop having an external clock signal which was also used in generating timing for the data signal;
sampling the delayed data signal using the locally generated clock signal to produce a sequence of samples; and
using the locally generated clock signal, generating a new re-timed data signal from the sequence of samples.

11. A method according to claim 10 further comprising low pass filtering the phase error signal before applying the variable delay.

12. A method according to claim 10 applied to a high speed serial data signal after transmission over a path which introduces jitter.

13. An eye opener circuit comprising:
a variable delay element adapted to apply a variable delay to an input data signal as a function of a phase error signal to produce a delayed data signal;
a phase detector and data re-timer adapted to compare the delayed data signal to a locally generated clock signal to produce the phase error signal, and to sample the data signal using the locally generated clock signal to generate a sequence of samples, and to generate a new re-timed data signal having low jitter using the locally generated clock signal;
a phase locked loop adapted to generate the locally generated clock signal, the phase lock loop driven by an external clock signal which was also used in generating timing for the input data signal.

14. An eye opener circuit according to claim 13 wherein the phase detector and data re-timer comprise a modified HOGGE detector.

15. An optical module comprising:

a transmit path for receiving an electrical signal, converting the electrical signal, to an optical signal and outputting the optical signal, the transmit path comprising an eye opener circuit, the eye opener circuit comprising:

a variable delay element adapted to apply variable delay to an input data signal as a function of a phase error signal to produce a delayed data signal;

a phase detector and data re-timer adapted to compare the delayed data signal to a locally generated clock signal to produce the phase error signal, and to sample the data signal using the locally generated clock signal to generate a sequence of samples, and to generate a new re-timed data signal having low jitter using the locally generated clock signal;

a phase locked loop adapted to generate the locally generated clock signal, the phase lock loop driven by an external clock signal which was also used in generating timing for the input data signal.

16. A method of re-timing a data signal comprising:

comparing the data signal to a locally generated clock signal to produce a phase error signal;

generating the locally generated clock signal with a phase locked loop having an external clock signal which was also used in generating timing for the data signal and by applying a variable delay to an output of the phase locked loop which is a function of the phase error signal;

sampling the data signal using the locally generated clock signal to produce a sequence of samples; and using the locally generated clock signal, generating a new re-timed data signal from the sequence of samples.

17. A method according to claim 16 further comprising low pass filtering the phase error signal before applying the variable delay.

18. A method according to claim 16 applied to a high speed serial data signal alter transmission over a path which introduces jitter.

19. An eye opener circuit comprising:

a phase detector and data re-timer adapted to compare an input data signal to a locally generated clock signal to produce a phase error signal, aid to sample the data signal using the locally generated clock signal to generate a sequence of samples, and to generate a new re-timed data signal having low jitter using the locally generated clock signal;

a phase locked loop driven by an external clock signal which was also used in generating timing for the input data signal;

a variable delay element adapted to produce the locally generated clock signal by applying a variable delay to an output of the phase locked loop, the variable delay being a function of the phase error signal.

* * * * *